United States Patent [19]

Bartel

[11] Patent Number: 4,752,756

[45] Date of Patent: Jun. 21, 1988

[54] ELECTRICAL SYSTEM WITH AT LEAST ONE ELECTRIC LOAD UNIT BEING DISCONNECTABLY ARRANGED ON A SURFACE

[76] Inventor: Bernhard Bartel, Strassbergerstr. 20, 8 Munchen 40, Fed. Rep. of Germany

[21] Appl. No.: 26,732

[22] Filed: Mar. 17, 1987

[30] Foreign Application Priority Data

Mar. 21, 1986 [DE] Fed. Rep. of Germany ....... 3609660

[51] Int. Cl.⁴ .............................................. H01H 9/00
[52] U.S. Cl. ..................................... 335/205; 335/207
[58] Field of Search ............... 335/205, 206, 207, 113, 335/120, 136, 208; 273/238, 239; 200/11 R, 61.11

[56] References Cited

U.S. PATENT DOCUMENTS 3,926,360  5/1974  Moister, Jr. .
4,324,405  4/1982  Kruger, Jr. et al. ................. 273/238
4,398,720  8/1983  Jones et al. ........................... 273/238

FOREIGN PATENT DOCUMENTS 1892432  6/1963  Fed. Rep. of Germany .
3151996  7/1983  Fed. Rep. of Germany .

Primary Examiner—E. A. Goldberg
Assistant Examiner—Lincoln Donovan
Attorney, Agent, or Firm—Steele, Gould & Fried

[57] ABSTRACT

The invention relates to an electrical system with at least one electric load unit (E) magnetically attached to a surface (F) being provided with path conductors (L). The load unit (E) comprises an electric load (G) being mounted on a socket (S). The socket (S) is provided with at least one magnet (M) and contacts (K) are arranged at the bottom side of the socket (S), through which contacts electrical energy supplied by a low-voltage source (SP) is fed to the load (G) via said path conductors (L). The contacts (K) are arranged such that the load (G) can be switched ON or OFF when the load unit (E) is displaced and/or turned. The load (G) may be as luminary.

11 Claims, 2 Drawing Sheets

ELECTRICAL SYSTEM WITH AT LEAST ONE ELECTRIC LOAD UNIT BEING DISCONNECTABLY ARRANGED ON A SURFACE

BACKGROUND OF THE INVENTION

The invention relates to an electric system with at least one electrical load unit being disconnectably arranged on a surface.

Such an electric system is known from German utility model No. 1 892 432 where a teaching and demostration means for electric circuitries is described, in which different structural members like resistors, incandescence lamps, capacitors and connecting lines are arranged in blocks. These blocks can be fixed to a surface with a ferromagnetic layer by means of a holding magnet. Electric energy is supplied to the blocks through connecting plugs which can be inserted into sockets provided laterally at the wall.

The German disclosure letter 31 51 996 describes a low-voltage lamp consisting of a reflector, a socket and rails for supplying electric energy. The reflector is fixed to the socket by means of a magnet in order to be able to adjust the reflector with respect to the socket. The socket is fixed to the rails and surrounds the rails so that the lamp can only be moved along the rails. In case the lamp should be placed on other rails, the socket has to be dismanteled.

In the German journal "Technische Rundschau 1974", volume 66, issue 38, pages 17 to 21, "Elektronikbaukästen und Experimentiersysteme", a base plate is shown having conductors with contact sockets into which sockets load units may be plugged in with corresponding contact pins. This is a similar arrangement like in the German utility model No. 1 892 432 mentioned above. Although in this known system the load units can only be placed at predetermined locations on the base plate. Also, the switching ON and OFF can only be done by separate means therefore.

The U.S. Pat. No. 3,926,360 shows unflexible electrical circuit boards having conductor paths arranged on their surfaces, and also flexible stripes of insulating material with conductor paths embedded therein. However, these circuit boards and stripes are used in connection with soldering the path connectors in the flexible stripes with the path connectors of the plugged board. The path connectors are not used for making contact with load units placed thereon.

SUMMARY OF THE INVENTION

It is the main object of the invention to create an electric system by means of which the electric load units can be arranged in a simple manner at arbitrary positions on a surface without particular connecting means or connecting lines for supplying electric energy being required.

This object is solved in an electric system with at least one electric load unit which is disconnectably arranged on a surface wherein said electric load unit has a socket at the bottom of which at least one magnet is provided for for detachably fixing said electric load unit to a surface, said surface has a plurality of essentially parallel path conductors being insulated from each other, of which respective even-numbered and odd-numbered path conductors are connected to each other and to a low-voltage source, contacts through which electric energy may be supplied to an electric load unit are arranged at the bottom of said socket and at least one magnet presses said socket against said surface so that, in a first position, the contacts may touch path conductors of differing voltage and, in a second position, may touch path conductors of the same voltage.

The electric system in accordance with the present invention combines the advantage of magnetic adhesion of an electric load unit at an arbitrary position of a surface with the advantages of electric energy supply through path conductors. Thus no mechanical fixing means and no additional electrical connecting lines to the individual electrical load units are required in the electrical system according to the present invention. In addition thereto the load unit can be switched ON or OFF by simply changing the position of the electrical load unit. It is made possible to arrange boards with as much loads as desired, e.g. lighting rows with as much luminaries as desired at arbitrary positions of the surface. This is possible in case of level as well as in case of curved surfaces.

At least one magnet is provided at the socket of the load unit, which magnet presses the load unit against the board.

It proved to be advantageous to provide two magnets which simultaneously also may be used as electric contacts It also is possible to arrange four magnets in star arrangement two of which magnets simultaneously are formed as contacts.

The path conductors may be strip-shaped, wire-shaped or rail-shaped, and they may be embedded in an insulating layer. For fixing additional ferromagnetic layers in the surface are not required if the path conductors already comprise a ferromagnetic material. However, it also is possible to provide ferromagnetic layers separated from the path conductor by at least one insulating layer. For decreasing the current density on the ferromagnetic path conductors it is advantageous if further path conductors out of non-ferromagnetic material, e.g. out of copper, are provided in contact with said path conductors.

The electric loads may be luminaries as e.g. incandescence lamps or spot lights being provided with reflectors. It also is possible to provide other electric loads as e.g. a fan or a plug connector for a remote load.

The surface with the path conductors may be formed as level surface or as curved surface. It may be plate-shaped, film-shaped or band-shaped.

For connecting the path conductors to the voltage source connecting lines may be provided at the ends or at given intervals. The connecting lines may be fixed permanently or be formed in plug-in like manner.

Now embodiments of the present invention will be explained with reference to the drawings.

LIST OF FIGURES

DETAILED ACCOUNT OF WORKING EXAMPLE OF THE INVENTION

Figure 1:
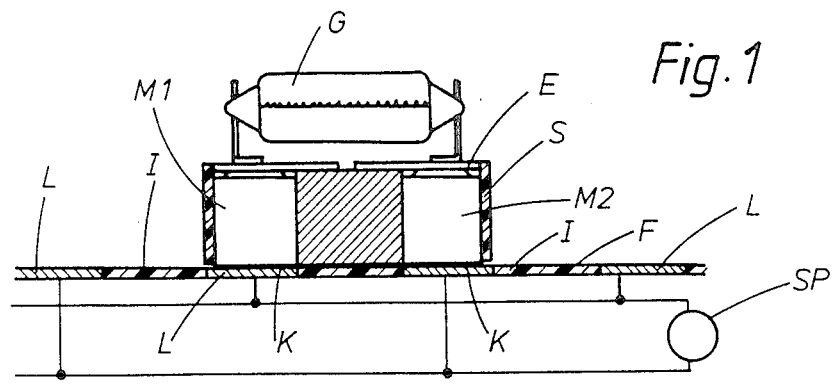
FIG. 1 is a sectional view of an electric load unit and a relating surface.

In the electric unit shown in FIG. 1 a plurality of path conductors L being essentially parallel to each other, are arranged on a surface F which may have the form of a plate, a folio or a band, the even-numbered path conductors and the odd-numbered path conductors being connected to one another and to the connections of a voltage source SP. For safety reasons the voltage source SP preferably is formed as low-voltage source. It may be a DC or an AC low-voltage source with a voltage of e.g. 6 Volt or 12 Volt. Respective adjacent path conductors are insulated from one another electrically, wherein the intervals may be filled by insulating layers I.

At least one electric load unit E comprising an electric load G is arranged on the surface F, being positionable freely. The load unit E comprises a socket S at the bottom side of which at least two contacts K are provided, by means of which electric energy can be supplied to the load G, e.g. to a luminary formed as incandescence lamp G. Furtheron, at least one magnet is provided in the socket S, by the magnetic force of which magnet the load unit E is pressed against the surface F. If two magnets M1 and M2 are provided those or the circumference of them may be simultaneously formed as contacts K. It is also possible to provide 4 magnets of which e.g. two are provided with the contacts K and two are insulated. The fixing to the surface is effected in that the path conductors L are formed ferromagnetically or that at least one ferromagnetic layer is provided for in the surface F.

When the load unit E is positioned on the surface F in such manner that the contacts K touch the path conductors L, electric energy is supplied by the voltage source SP to the load G on the socket S so that the load G, e.g. being formed as incandescence lamp, emits light. If, however, the load unit E is turned by 90° or is displaced in such manner that the contacts K do not touch the respective path conductor L, electric energy no longer is fed to the load G so that the latter is switched OFF. Thus, the load G may be switched ON or OFF by turning or/and shifting the load unit E.

Figure 2:
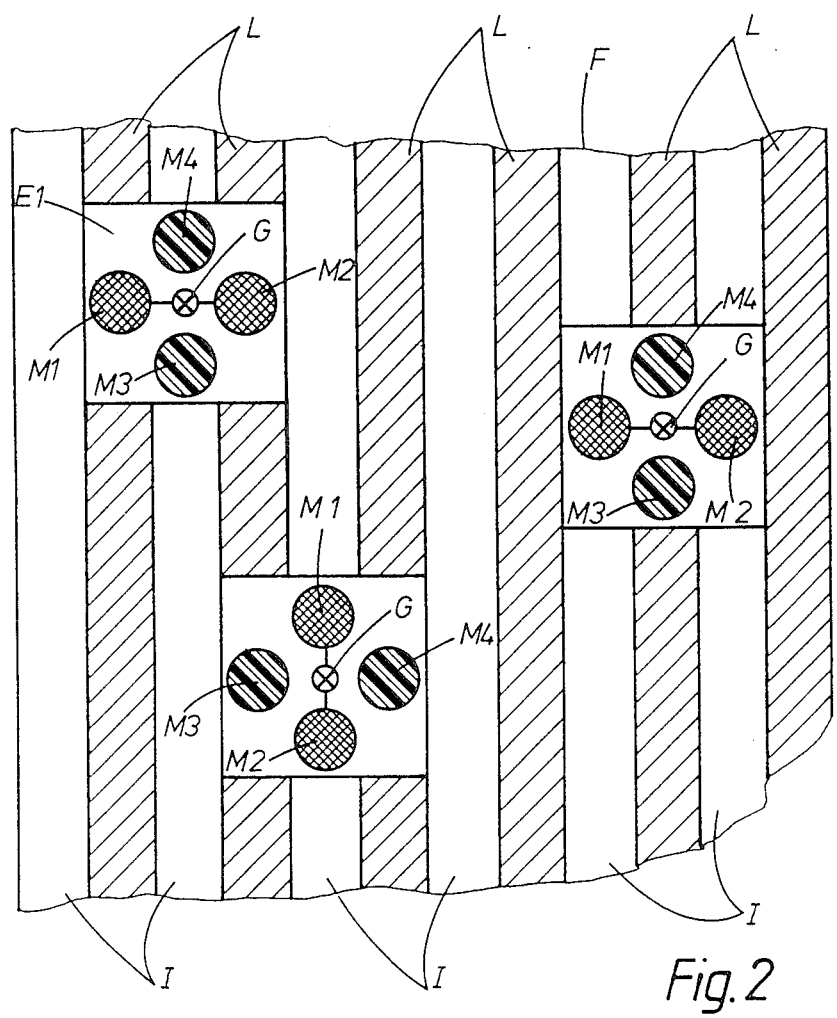
FIG. 2 is a schematic top view of a section of the electric system.

In the electric system shown in FIG. 2 three load units E1 to E3 are arranged on the surface F comprising the path conductors L; only the bottom portion of such load units and the load G, respectively are shown schematically. Each load unit E1 to E3 has four magnets M1 to M4 being arranged starlike at the corners of a thought square. The magnets M1 and M2 on one hand are provided with contacts K and on the other hand electrically connected to the load G. Magnets M3 and M4, however, are arranged in insulated position.

The load unit E1 is arranged on the surface F in such manner that the magnets M1 and M2 are put on the path conductors L whereas the magnets M3 and M4 are put on the insulating layer I running inbetween. As the magnets M1 and M2 have contacts K electric energy is fed from the voltage source SP to the load G shown schematically so that the latter is switched ON.

For switching OFF the load G the load unit E1 may be shifted to a position corresponding to the position of the load unit E2 in which position the magnets M3 and M4 are put on the path conductors L whereas the magnets M1 and M2 come to lie on the insulating layer I.

The switching OFF of the load G may also be effected in that the load unit E1 is turned by 90° around an axis perpendicular to the surface F. This position corresponds to the position of the load unit E3, in which position the magnets M1 and M2 come to lie on the insulating layer I or on one and the same path conductor L.

Thus, the electric load G of the load units E1 to E3 may be switched ON or OFF by shifting and/or turning so that no switch is required. By means of providing a plurality of path conductors L on the surface F it is made possible to arrange the load units E in quite unimpeded manner on the surface F and to respectively switch them ON or OFF by turning and/or shifting.

Figure 3:
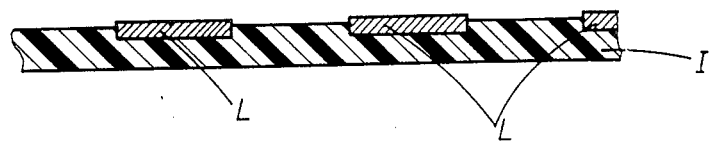
FIGS. 3 to 7 are sectional views of different surfaces being provided with path conductors.

In the surface F shown in FIG. 3 the path conductors L are arranged in an insulating layer I. In this case the path conductors L are provided with a ferromagnetic material and serve for electric energy supply as well as for holding the load unit E.

Figure 4:
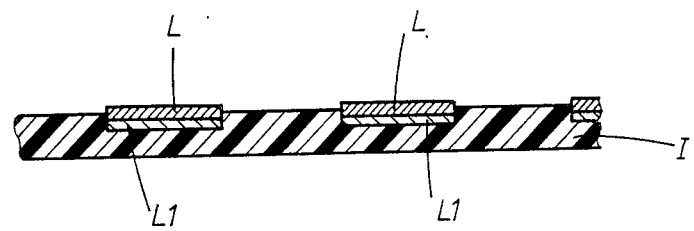

In the embodiment of the surface F shown in FIG. 4 the path conductors F also are embedded in the insulating layer. Below the path conductors L made out of ferromagnetic material, however, further path conductors L1 are provided for for reducing the electric resistivity in the path conductors L, which further path conductors consists of electrically conducting material which is not ferromagnetic, e.g. copper.

Figure 5:

FIG. 5 shows a similar surface F in which, however, the further path conductors L1 are not arranged below the path conductor L but beside the latter.

Figure 6:
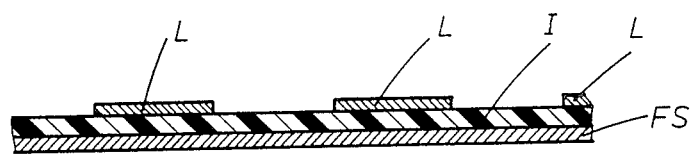

FIG. 6 shows a surface F having a ferromagnetic layer FS above which layer an insulating layer I is arranged on or in which the path conductors L are arranged.

Figure 7:
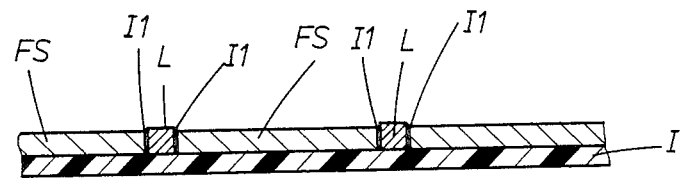

Finally FIG. 7 as yet shows wire-shaped or rail-shaped path conductors L being disposed on the insulating layer I and between which conductors ferromagnetic layers FS separated by insulating layers I1 are provided for the magnets M.

In all cases the surfaces F may be formed as level or curved plates or folios, wherein in particular the folios also may be band-shaped so that those, e.g. in case of need, may be cut from a roll. In this case the surfaces may be disposed at a wall or a ceiling like a wallpaper.

For feeding electric energy to the path conductors L power supply bars fixable to the ends of the surfaces, e.g. to be slipped over such ends, are provided for. It also is possible to supply the electric energy at given intervals within the surface.

Figure 8:
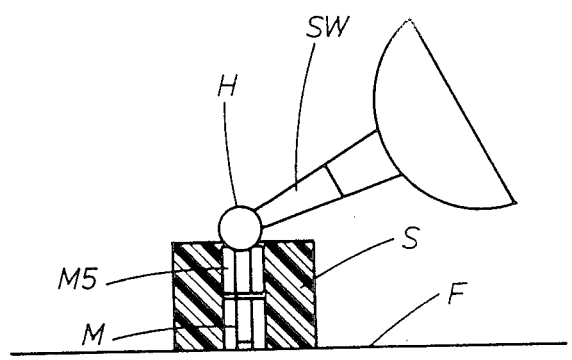
FIG. 8 is another embodiment of an electrical load unit.

Also spot lights may be provided as electric loads G on the load units, see FIG. 8. Therein the spot light SW may also be held by at least one magnet M5 and the electric energy may be fed via contact areas at the holding member A.

Electric loads may also be various electrical apparatusses, e.g. an electric fan. It is also possible to build one load unit E as plug-in connection and to provided it with sockets. In this case it is very simple to arrange the load unit E at different positions on the surface F and to supply electric energy to a remote electric load through a plugged-in plug.

What is claimed:
1. Electric system for coupling a low-voltage source to at least one electric load unit being disconnectably arranged on a surface wherein
said electric load unit includes a socket at the bottom of which at least one magnet means for a detachably fixing said electric load unit to said surface,
said surface has a plurality of essentially parallel path conductors being insulated from each other, of which respective even-numbered and odd-numbered path conductors are connected to each other and to said low-voltage source, contact means, for supplying electric energy to said at least one electric load unit, are arranged at the bottom of said socket, and said at least one magnet means is attracted to surface so that, in a first position, the contact means touch path conductors of differing voltage and, in a second position, touch path conductors of the same voltage.

2. Electric system according to claim 1 wherein said magnet means is at least two magnets, both being formed as electric contact means, are provided at the bottom side of said socket.

3. Electric system according to claim 1 wherein said magnet means is four magnets are in said socket, two of which magnets both are formed as contacts and two of which magnets are insulated.

4. Electric system according to claim 1 wherein said path conductors are formed in the shape of strips.

5. Electric system according to claim 4 wherein said path conductors are embedded in an insulating layer.

6. Electric system according to claim 4 wherein said path conductors comprise ferromagnetic material.

7. Electric system according to claim 6 wherein further path conductors are made out of non-ferromagnetic material and are arranged in contact with path conductors that are made out of ferromagnetic material.

8. Electric system according to claim 1 wherein said surface has at least one ferromagnetic layer which is separated from said path conductor by an insulating layer.

9. Electric system according to claim 1 wherein said path conductors are arranged on an insulating layer and ferromagnetic layers are arranged in parallel to said path conductors and insulated therefrom and from said low-voltage source.

10. Electric system according to claim 1 wherein said surface is formed by a plate.

11. Electric system according to claim 1 wherein said surface is formed by a flexible film.

* * * * *